(12) United States Patent
Yamamoto

(10) Patent No.: US 8,867,292 B2
(45) Date of Patent: Oct. 21, 2014

(54) SEMICONDUCTOR DEVICE, METHOD OF RETRIEVING DATA, AND MICROCOMPUTER

(71) Applicant: Lapis Semiconductor Co., Ltd., Kanagawa (JP)

(72) Inventor: Shohei Yamamoto, Kanagawa (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 13/915,888

(22) Filed: Jun. 12, 2013

(65) Prior Publication Data

US 2013/0336078 A1 Dec. 19, 2013

(30) Foreign Application Priority Data

Jun. 18, 2012 (JP) .................. 2012-136843

(51) Int. Cl.
*G11C 7/02* (2006.01)
*G11C 7/08* (2006.01)
*G11C 7/06* (2006.01)

(52) U.S. Cl.
CPC . *G11C 7/065* (2013.01); *G11C 7/08* (2013.01)
USPC .............. 365/210.1; 365/185.21; 365/189.05; 365/189.15; 365/230.03; 365/203

(58) Field of Classification Search
CPC .... G11C 16/26; G11C 16/28; G11C 16/0441; G11C 7/065; G11C 11/4096; G11C 11/4116
USPC ............ 365/185.21, 207, 189.05, 18.15, 365/189.16, 203, 210.1, 230.039
See application file for complete search history.

(56) References Cited

U.S. PATENT DOCUMENTS 6,198,682 B1 * 3/2001 Proebsting .................... 365/207

FOREIGN PATENT DOCUMENTS

JP 2008-065966 A 3/2008
JP 2008-117510 A 5/2008

* cited by examiner

*Primary Examiner* — Thong Q Le
(74) *Attorney, Agent, or Firm* — Kubotera & Associates, LLC

(57) ABSTRACT

A semiconductor device includes a data memory cell for storing data; a reference data memory cell for storing reference data to be compared with the data; an inverted data memory cell for storing inverted data of the reference data; a sense amplifier unit; and a data output unit. In a first retrieving process, the sense amplifier unit differentially amplifies the data and the reference data, and adjusts an output thereof when a voltage difference between the data and the reference data becomes a predetermined retrievable voltage difference. In a second retrieving process, the sense amplifier unit differentially amplifies the data and the inverted data, and adjusts an output thereof when a voltage difference between the data and the inverted data becomes the predetermined retrievable voltage difference. The data output unit determines and outputs the data according to a result of the first retrieving process and the second retrieving process.

10 Claims, 7 Drawing Sheets

SEMICONDUCTOR DEVICE, METHOD OF RETRIEVING DATA, AND MICROCOMPUTER

BACKGROUND OF THE INVENTION AND RELATED ART STATEMENT

The present invention relates to a semiconductor device having a memory cell and a sense amplifier, a method of retrieving data, and a microcomputer. More preferably, the present invention relates to a semiconductor device, a method of retrieving data, and a microcomputer suitable for accurately retrieving data at a low voltage without increasing a circuit size.

Recently, the number of electric devices operating at a low voltage has been increased. With the increase in the number of such electric devices, it has been required to operate a memory that is disposed in such electric devices at a power source voltage less than 1.0 V.

However, when the memory cell is operated at a low voltage, a voltage difference in information between "1" and "0" written in the memory cell tends to become minuscule. Accordingly, when the information ("1" or "0") written in the memory cell is retrieved, it is necessary to accurately determine the voltage difference in the information ("1" or "0") in a sense amplifier where the voltage of the information is amplified and output.

More specifically, when the power source voltage is 1.0 V, for example, if the information "1" has the voltage between 0.6 V and 1.0 V, and the information "0" has the voltage between 0.0 V and 0.4 V, it is necessary to distinguish between the information "1" and the information "0" by the voltage of 0.2 V (0.6-0.4=0.2). Accordingly, when the sense amplifier does not possess high accuracy, and the memory cell has a large variance, it is difficult to accurately retrieve the information ("1" or "0") when the memory cell is operated at the low voltage.

In order to solve the problems described above, Patent References No. 1 and No. 2 have disclosed a conventional semiconductor device. FIG. 7 is a schematic diagram showing a configuration of the conventional semiconductor device disclosed in Patent References No. 1 and No. 2.

Patent Reference No. 1: Japanese Patent Publication No. 2008-065966

Patent Reference No. 2: Japanese Patent Publication No. 2008-117510

As shown in FIG. 7, the conventional semiconductor device includes a memory cell array unit 71 and a sense amplifier (SA) 72. In the memory cell array unit 71, pairs of a memory cell A and a memory cell B are provided corresponding to one data (information). When the data is written in the memory cell A, the data is inverted and written in the memory cell B. When the data is retrieved, the sense amplifier 72 retrieves each of the data written in the memory cell A and the memory cell B. Accordingly, it is possible to accurately retrieve the data even if the memory cell A and the memory cell B have a variance due to the operation at the low voltage.

In the conventional semiconductor device disclosed in Patent References No. 1 and No. 2, it is necessary to provide a pair of the memory cell A and the memory cell B relative to one data, thereby making an area of the memory cell array unit 71 double. Further, it is necessary to keep an electrical current flowing through the sense amplifier 72 when the sense amplifier 72 retrieves the data.

In view of the problems described above, an object of the present invention is to provide a semiconductor device capable of solving the problems of the conventional semiconductor device. In the present invention, it is possible to accurately retrieve data during an operation at a low voltage with a fewer number of memory cells, so that it is possible to prevent a circuit scale of the semiconductor device for retrieving the data at the low voltage from increasing.

Further objects and advantages of the invention will be apparent from the following description of the invention.

SUMMARY OF THE INVENTION

In order to attain the objects described above, according to a first aspect of the present invention, a semiconductor device includes a data memory cell for storing data; a reference data memory cell for storing reference data to be compared with the data; an inverted data memory cell for storing inverted data of the reference data; a sense amplifier unit; and a data output unit.

According to the first aspect of the present invention, in the semiconductor device, the sense amplifier unit is configured to perform a first retrieving process, in which the sense amplifier unit differentially amplifies the data stored in the data memory cell and the reference data stored in the reference data memory cell, and adjusts an output thereof when a voltage difference between the data and the reference data becomes a predetermined retrievable voltage difference. Further, the sense amplifier unit is configured to perform a second retrieving process, in which the sense amplifier unit differentially amplifies the data stored in the data memory cell and the inverted data stored in the inverted data memory cell, and adjusts an output thereof when a voltage difference between the data and the inverted data becomes the predetermined retrievable voltage difference.

According to the first aspect of the present invention, in the semiconductor device, the data output unit is configured to determine and output the data stored in the data memory cell according to a result of the first retrieving process and a result of the second retrieving process performed with the sense amplifier unit.

According to a second aspect of the present invention, a method is for retrieving data in a semiconductor device. The semiconductor device includes a data memory cell for storing data; a reference data memory cell for storing reference data to be compared with the data; an inverted data memory cell for storing inverted data of the reference data; a sense amplifier unit; and a data output unit.

According to the second aspect of the present invention, the method of retrieving the data includes a first retrieving step of differentially amplifying the data stored in the data memory cell and the reference data stored in the reference data memory cell, and adjusting an output of the sense amplifier unit when a voltage difference between the data and the reference data becomes a predetermined retrievable voltage difference. Further, the method of retrieving the data includes a second retrieving step of differentially amplifying the data stored in the data memory cell and the inverted data stored in the inverted data memory cell, and adjusting an output of the sense amplifier unit when a voltage difference between the data and the inverted data becomes the predetermined retrievable voltage difference. Further, the method of retrieving the data includes a data output step of determining and outputting the data stored in the data memory cell according to a result of the first retrieving process and a result of the second retrieving process performed with the sense amplifier unit.

According to a third aspect of the present invention, a microcomputer includes the semiconductor device in the first aspect and a central processing unit for accessing to the data memory cell of the semiconductor device through a bus.

As described above, in the present invention, it is possible to accurately retrieve the data during an operation at a low voltage with a fewer number of the memory cells, so that it is possible to prevent a circuit scale of the semiconductor device that performs the retrieving operation of the data at the low voltage from increasing.

DETAILED DESCRIPTION OF PREFERRED EMBODIMENTS

Hereunder, preferred embodiments of the present invention will be explained with reference to the accompanying drawings.

First Embodiment

Figure 1:
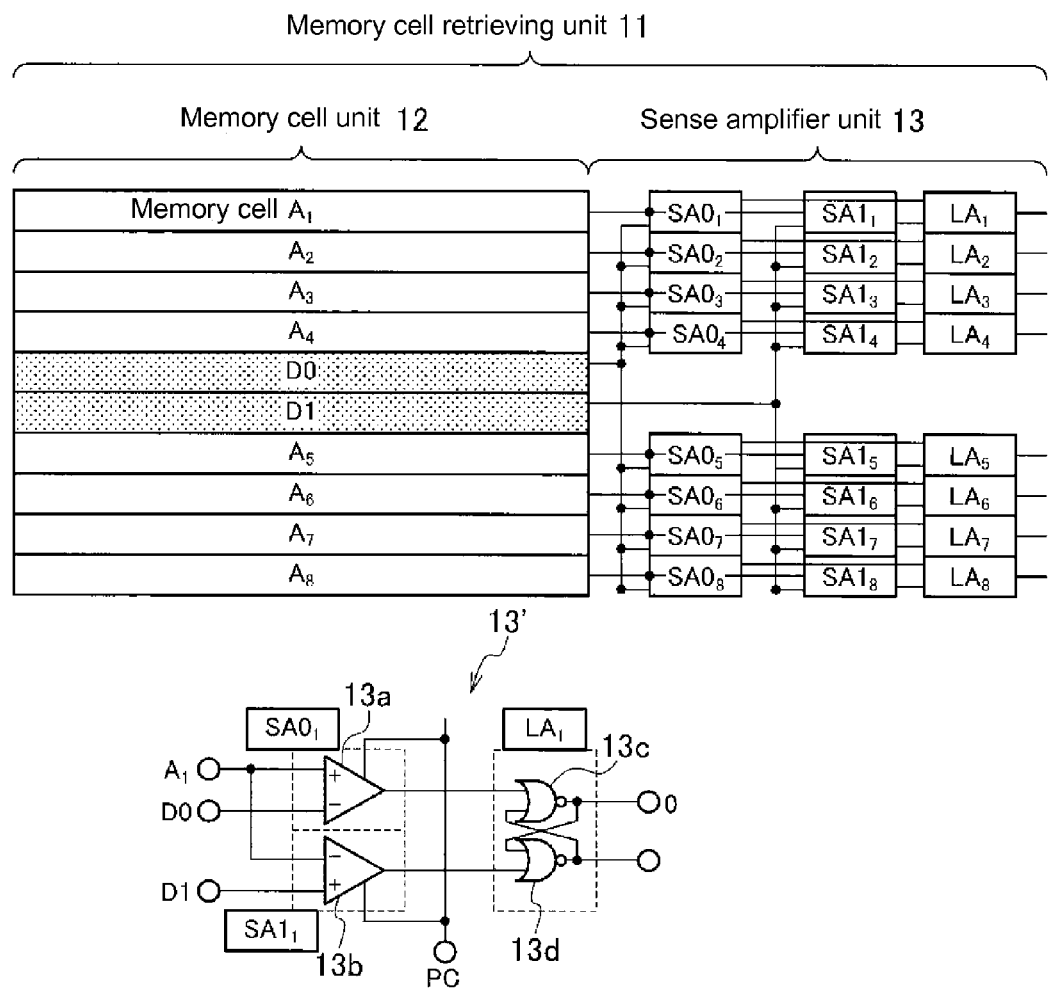
FIG. 1 is a schematic diagram showing a configuration of a semiconductor device according to a first embodiment of the present invention.

A first embodiment of the present invention will be explained. FIG. 1 is a schematic diagram showing a configuration of a semiconductor device 10 having a memory cell and a sense amplifier according to the first embodiment of the present invention. As shown in FIG. 1, the semiconductor device 10 includes a memory cell retrieving unit 11 having a memory cell unit 12 and a sense amplifier unit 13.

In the first embodiment, the memory cell unit 12 includes eight memory cells A1 to A8 for storing data; a memory cell D0 as a reference data memory cell for storing data with a low level (0) as reference data in advance; and a memory cell D1 as an inverted data memory cell for storing data with a high level (1) as inverted data of the reference data.

In the first embodiment, the sense amplifier unit 13 includes sense amplifiers SA01 to SA08, sense amplifiers SA11 to SA18, and latches LA1 to LA8. It should be noted that the latches LA1 to LA8 correspond to a data output unit, and the data output unit is disposed in the sense amplifier unit 13.

In the first embodiment, each of the sense amplifiers SA01 to SA08 has one input terminal connected to each of the memory cells A1 to A8, and another input terminal connected to the memory cell D0. Further, each of the sense amplifiers SA11 to SA18 has one input terminal connected to each of the memory cells A1 to A8, and another input terminal connected to the memory cell D1. Further, each of the latches LA1 to LA8 has one input terminal connected to each of the sense amplifiers SA01 to SA08, and another input terminal connected to the sense amplifiers SA11 to SA18.

As shown in FIG. 1, a sense amplifier unit 13' as one representation of the sense amplifier unit 13 includes the sense amplifier SA01, the sense amplifier SA11, and the latch LA1. In the sense amplifier unit 13', the sense amplifier SA01 and the sense amplifier SA11 include differential amplifier units 13a and 13b. Further, the latch LA1 has an SR latch configuration including two NOR circuits 13c and 13d.

In the first embodiment, a plus terminal of the sense amplifier SA01 and a minus terminal of the sense amplifier SA11 are connected to the memory cell A1. A minus terminal of the sense amplifier SA01 is connected to the memory cell D0, and a plus terminal of the sense amplifier SA11 is connected to the memory cell D1, respectively.

In the first embodiment, an output terminal of the sense amplifier SA01 is connected to a reset (R) terminal of the latch LA1, and an output terminal of the sense amplifier SA11 is connected to a set (S) terminal of the latch LA1. It should be noted that a bit line is connected to the sense amplifier SA01, the sense amplifier SA11, the memory cell D0, and the memory cell D1. When the data is retrieved, the bit line is charged a pre-charge unit PC during a pre-charge time (refer to FIG. 2).

As shown in FIG. 1, in the memory cell retrieving unit 11 of the semiconductor device 10, the memory cells are arranged in ten stages. Among the ten stages configuration, the eight stages of the memory cells A1 to A8 are areas where the data is stored. Further, the remaining two stages are the memory cell D0 for storing the data with the low level (0) in advance as the reference data for the sense amplifiers upon retrieving the data and the memory cell D1 for storing the data with the high level (1) in advance.

Further, in the first embodiment, the memory cells A1 to A8 and the memory cell D0 are connected to the sense amplifiers SA01 to SA08, and the memory cells A1 to A8 and the memory cell D1 are connected to the sense amplifiers SA11 to SA18, respectively. Further, the output terminals of the sense amplifiers SA01 to SA08 and the sense amplifiers SA11 to SA18 are connected to the latches LA1 to LA8.

Figure 2:
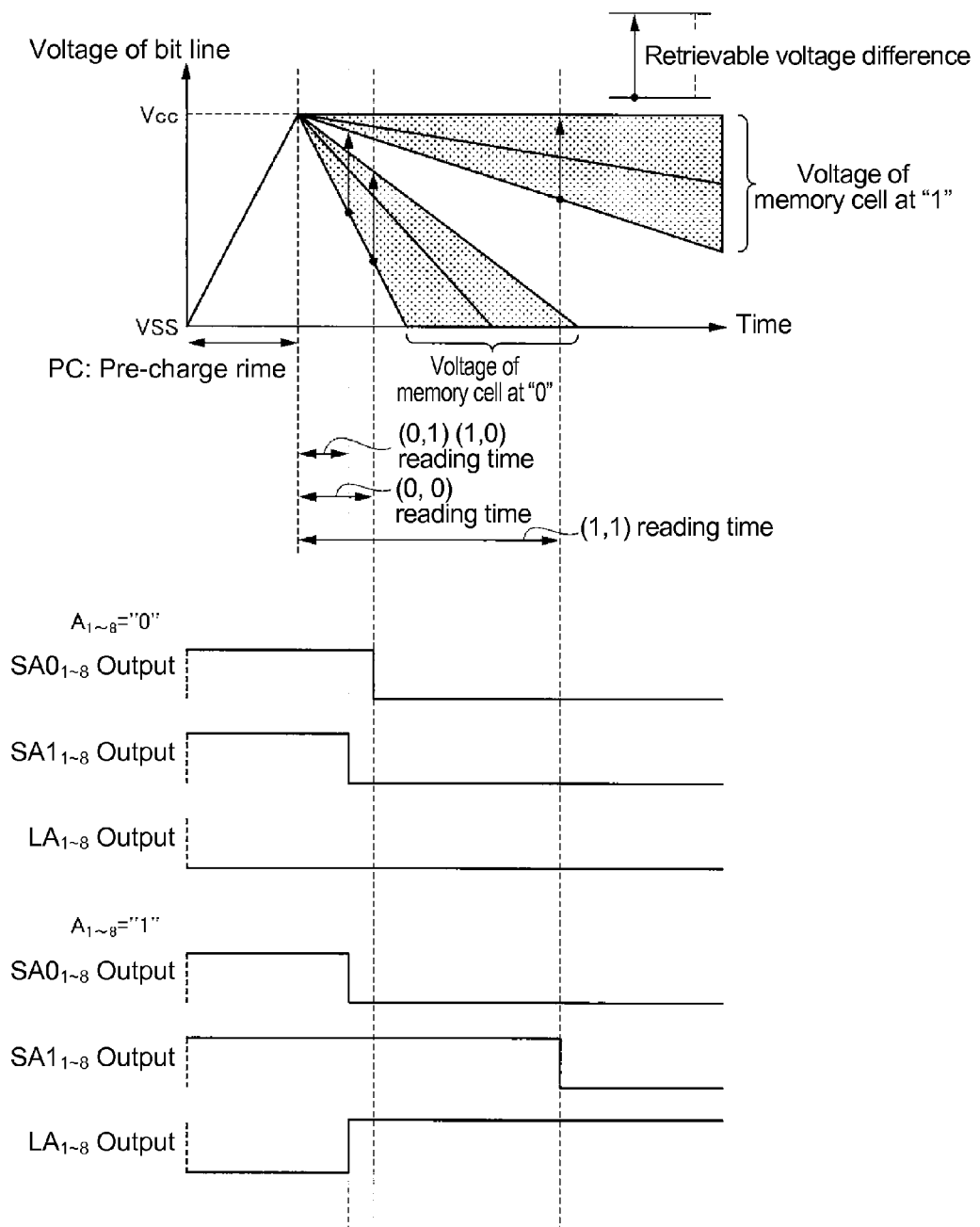
FIG. 2 is a schematic chart showing an operation of the semiconductor device according to the first embodiment of the present invention.

An operation of the semiconductor device 10 in the data retrieving process will be explained next with reference to FIG. 2. FIG. 2 is a schematic chart showing the operation of the semiconductor device 10 according to the first embodiment of the present invention.

In the operation, during the pre-charge time, the output of the memory cells A1 to A8, the outputs of the sense amplifiers SA01 to SA08, and the outputs of the sense amplifiers SA01 to SA08 become a power source voltage level Vcc. After the pre-charge time is elapsed, the data retrieving process is started.

As shown in FIG. 2, in the data retrieving process after the pre-charge time is elapsed, the bit line that is connected to the memory cells, where the data with the low level (0) is written, is promptly, for example, in 10 nsec, discharged to a ground level VSS. Further, the bit line that is connected to the memory cells, where the data with the high level (1) is written, is promptly, for example, in 10 μsec, discharged to the ground level VSS.

In the data retrieving process, when the inputs of the sense amplifiers SA01 to SA08 or the sense amplifiers SA11 to SA18 are (0, 1) or (1, 0), the difference between the two inputs becomes maximum. Accordingly, the sense amplifiers SA01 to SA08 or the sense amplifiers SA11 to SA18 are operated at the highest speed.

More specifically, when the data of the memory cells A1 to A8 is the low level "0", the outputs of the sense amplifiers SA11 to SA18 are changed from "1" to "0" at a speed faster than that of the outputs of the sense amplifiers SA01 to SA08. As described above, the output terminals of the sense amplifiers SA11 to SA18 are connected to the set terminals of the latches LA01 to LA08. In this case, the outputs of the latches LA01 to LA08 are remained at the low level "0". Accordingly, at the timing when the outputs of the sense amplifiers SA11 to SA18 are changed from "1" to "0", the data with the low level "0" of the memory cells A1 to A8 is output from the latches LA01 to LA08.

On the other hand, when the data of the memory cells A1 to A8 is the high level "1", the outputs of the sense amplifiers SA01 to SA08 are changed from "1" to "0" at a speed faster than that of the outputs of the sense amplifiers SA11 to SA18. As described above, the output terminals of the sense amplifiers SA01 to SA08 are connected to the set terminals of the latches LA01 to LA08. In this case, the outputs of the latches LA01 to LA08 are changed from the low level "0" to the high level "1". Accordingly, at the timing when the outputs of the sense amplifiers SA11 to SA18 are changed from "1" to "0", the data with the high level "1" of the memory cells A1 to A8 is output from the latches LA01 to LA08.

As described above, in the semiconductor device 10 having the configuration shown in FIG. 1 for performing the operation shown in FIG. 2 according to the first embodiment of the present invention, the memory cells D0 and D1 are disposed in the memory cell unit 12 for storing in advance the reference data and the inverted data with the high level "1" and the low level "0". Further, the memory cells D0 and D1 are connected to the differential sense amplifiers SA01 to SA08 and SA11 to SA18 disposed in the sense amplifier unit 13, respectively. Accordingly, it is possible to accurately perform the data retrieving process at the low voltage without increasing the number of the memory cells.

More specifically, in the first embodiment, without impairing the characteristics of the differential sense amplifiers, that is, good tolerance against a variance or a noise, it is possible to reduce the stages of the memory cell array from sixteen necessary for the conventional configuration to ten.

In particular, a ratio of an area for forming one sense amplifier to an area for forming one memory cell is greater than 1:10. In the first embodiment of the present invention, although the number of the sense amplifiers is increased, as opposed to the conventional configuration disclosed in Patent References No. 1 and No. 2, where two memory cells are provided relative to one data, it is still possible to reduce the circuit size.

Second Embodiment

Figure 3:
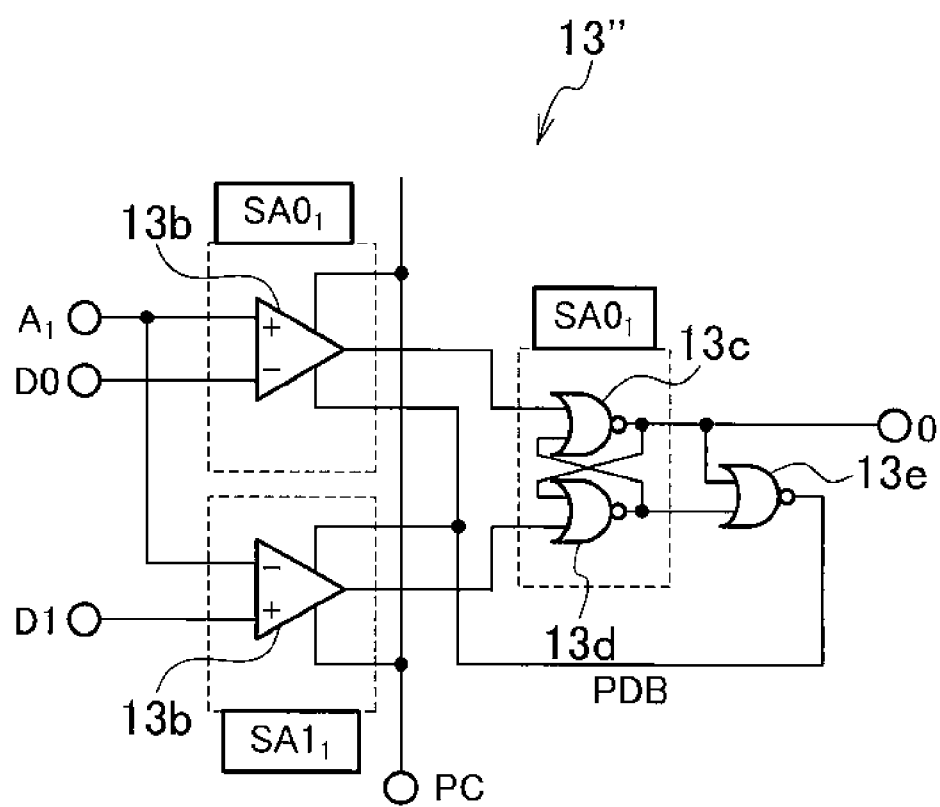
FIG. 3 is a schematic diagram showing a configuration of a semiconductor device according to a second embodiment of the present invention.

A second embodiment of the present invention will be explained next with reference to FIGS. 3 and 4. FIG. 3 is a schematic diagram showing a configuration of a semiconductor device according to the second embodiment of the present invention.

As shown in FIG. 3, in addition of the configuration of the sense amplifier unit 13' in the first embodiment, a sense amplifier unit 13" of the semiconductor device according to the second embodiment includes an NOR circuit 13e. More specifically, similar to the sense amplifier unit 13', the sense amplifier unit 13" includes the sense amplifier SA01, the sense amplifier SA11, and the latch LA1. In the sense amplifier unit 13", the sense amplifier SA01 and the sense amplifier SA11 include the differential amplifier units 13a and 13b, respectively. Further, the latch LA1 has the SR latch configuration including the two NOR circuits 13c and 13d.

As shown in FIG. 3, two output terminals of the latch circuit LA1 are connected to two input terminals of the NOR circuit 13e. Further, an output PDB of the NOR circuit 13e is connected to power down terminals of the differential sense amplifiers SA01 and SA11, respectively.

In the second embodiment of the present invention, with the configuration of the sense amplifier unit 13" as described above, when the data is completely retrieved from the memory cell A1, one of the NOR circuits 13c and 13d of the latch circuit LA1 is changed from the low level "0" to the high level "1". Accordingly, when the data is completely retrieved from the memory cell A1, the output PDB of the NOR circuit 13e is changed from the high level "1" to the low level "0". As a result, the output PDB of the NOR circuit 13e shuts down a current flowing through the sense amplifiers SA01 and SA11, respectively, so that the outputs of the sense amplifiers SA01 and SA11 are fixed to the low level "0".

An operation of the semiconductor device having the sense amplifier 13" shown in FIG. 3 in the data retrieving process will be explained next with reference to FIG. 4. FIG. 4 is a schematic chart showing the operation of the semiconductor device according to the first embodiment of the present invention.

Similar to the operation shown in FIG. 2, during the pre-charge time, the output of the memory cells A1 to A8, the outputs of the sense amplifiers SA01 to SA08, and the outputs of the sense amplifiers SA01 to SA08 become a power source voltage level Vcc. After the pre-charge time is elapsed, the data retrieving process is started.

Figure 4:
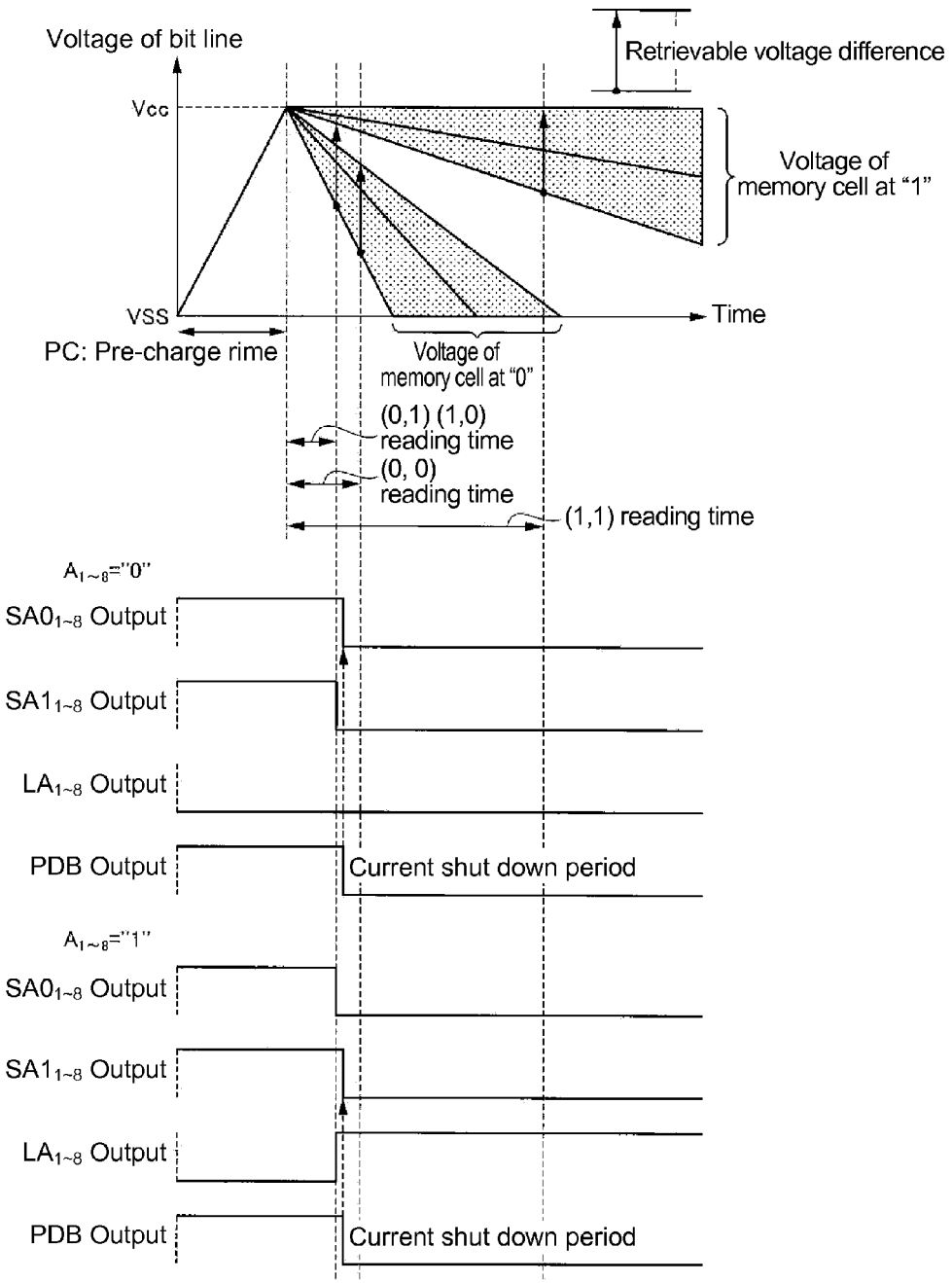
FIG. 4 is a schematic chart showing an operation of the semiconductor device according to the first embodiment of the present invention.

As shown in FIG. 4, similar to the operation shown in FIG. 2, in the data retrieving process after the pre-charge time is elapsed, the bit line that is connected to the memory cells, where the data with the low level (0) is written, is promptly, for example, in 10 nsec, discharged to the ground level VSS. Further, the bit line that is connected to the memory cells, where the data with the high level (1) is written, is promptly, for example, in 10 μsec, discharged to the ground level VSS.

In the data retrieving process, when the inputs of the sense amplifiers SA01 to SA08 or the sense amplifiers SA11 to SA18 are (0, 1) or (1, 0), the difference between the two inputs becomes maximum. Accordingly, the sense amplifiers SA01 to SA08 or the sense amplifiers SA11 to SA18 are operated at the highest speed.

More specifically, when the data of the memory cells A1 to A8 is the low level "0", the outputs of the sense amplifiers SA11 to SA18 are changed from "1" to "0" at a speed faster than that of the outputs of the sense amplifiers SA01 to SA08. As described above, the output terminals of the sense amplifiers SA11 to SA18 are connected to the set terminals of the latches LA01 to LA08. In this case, the outputs of the latches LA01 to LA08 are remained at the low level "0". Accordingly, at the timing when the outputs of the sense amplifiers SA11 to SA18 are changed from "1" to "0", the data with the low level "0" of the memory cells A1 to A8 is output from the latches LA01 to LA08.

On the other hand, when the data of the memory cells A1 to A8 is the high level "1", the outputs of the sense amplifiers SA01 to SA08 are changed from "1" to "0" at a speed faster than that of the outputs of the sense amplifiers SA11 to SA18. As described above, the output terminals of the sense amplifiers SA01 to SA08 are connected to the set terminals of the latches LA01 to LA08. In this case, the outputs of the latches LA01 to LA08 are changed from the low level "0" to the high level "1". Accordingly, at the timing when the output of the sense amplifiers SA11 to SA18 is changed from "1" to "0", the data with the high level "1" of the memory cells A1 to A8 is output from the latches LA01 to LA08.

In the semiconductor device in the second embodiment, with the configuration of the sense amplifier unit 13" as described above, when the data is completely retrieved from the memory cells A1 to A8, the output of one of the NOR circuits 13c and 13d of the latch circuit LA1 is changed from the low level "0" to the high level "1".

More specifically, in the operation shown in FIG. 4, when the data of the memory cell A1 is the low level "0", the output of the sense amplifier SA11 is changed from "1" to "0" first. Accordingly, the output of the NOR circuit 13d of the latch circuit LA1 is changed from "0" to "1". As a result, the output PDB from the NOR circuit 13e is inverted from "1" to "0".

In the second embodiment, as described above, the output PDB of the NOR circuit 13e is connected to the power down terminals of the differential sense amplifiers SA01 and SA11, respectively. Accordingly, when the output PDB of the NOR circuit 13e becomes the low level "0", the output PDB of the NOR circuit 13e shuts down the current flowing through the sense amplifiers SA01 and SA11, respectively. As a result, the output of the sense amplifier SA01 is changed from the high level "1" to the low level "0".

Further, in the operation shown in FIG. 4, when the data of the memory cell A1 is the high level "1", the output of the sense amplifier SA01 is changed from "1" to "0" first. Accordingly, the output of the NOR circuit 13c of the latch circuit LA1 is changed from "0" to "1". As a result, the output PDB from the NOR circuit 13e is inverted from "1" to "0".

In the second embodiment, as described above, when the output PDB of the NOR circuit 13e becomes the low level "0", the output PDB of the NOR circuit 13e shuts down the current flowing through the sense amplifiers SA01 and SA11, respectively. As a result, the output of the sense amplifier SA11 is changed from the high level "1" to the low level "0".

As described above, in the second embodiment, when the outputs of the sense amplifiers SA01 and SA11 become the low level "0", the two inputs (the reset terminal R, and the set terminal S) of the latch circuit LA1 become the low level "0". Accordingly, the latch circuit LA1 can hold the data retrieved immediately before.

As described above, in the second embodiment of the present invention explained with reference to FIGS. 3 and 4, the semiconductor device includes the memory cells D0 and D1 in the memory cell unit 12 for storing the reference data and the inverted data in advance. Further, the memory cells D0 and D1 are connected to the sense amplifiers SA01 to SA08 and SA11 to SA18 disposed in the sense amplifier unit 13, respectively. Accordingly, it is possible to accurately retrieve the data at the low voltage with a fewer number of the memory cells. Further, when the data is completely retrieved, it is possible to shut down the current flowing through the sense amplifiers SA01 to SA08 and SA11 to SA18, thereby making it possible to reduce power consumption.

Further, when the current flowing through the sense amplifiers SA01 to SA08 and SA11 to SA18 is shut down, the two inputs (the reset terminal R, and the set terminal S) of the latch circuits LA1 to LA8 become the low level "0". Accordingly, the latch circuits LA1 to LA8 can hold the data retrieved immediately before.

Figure 5:
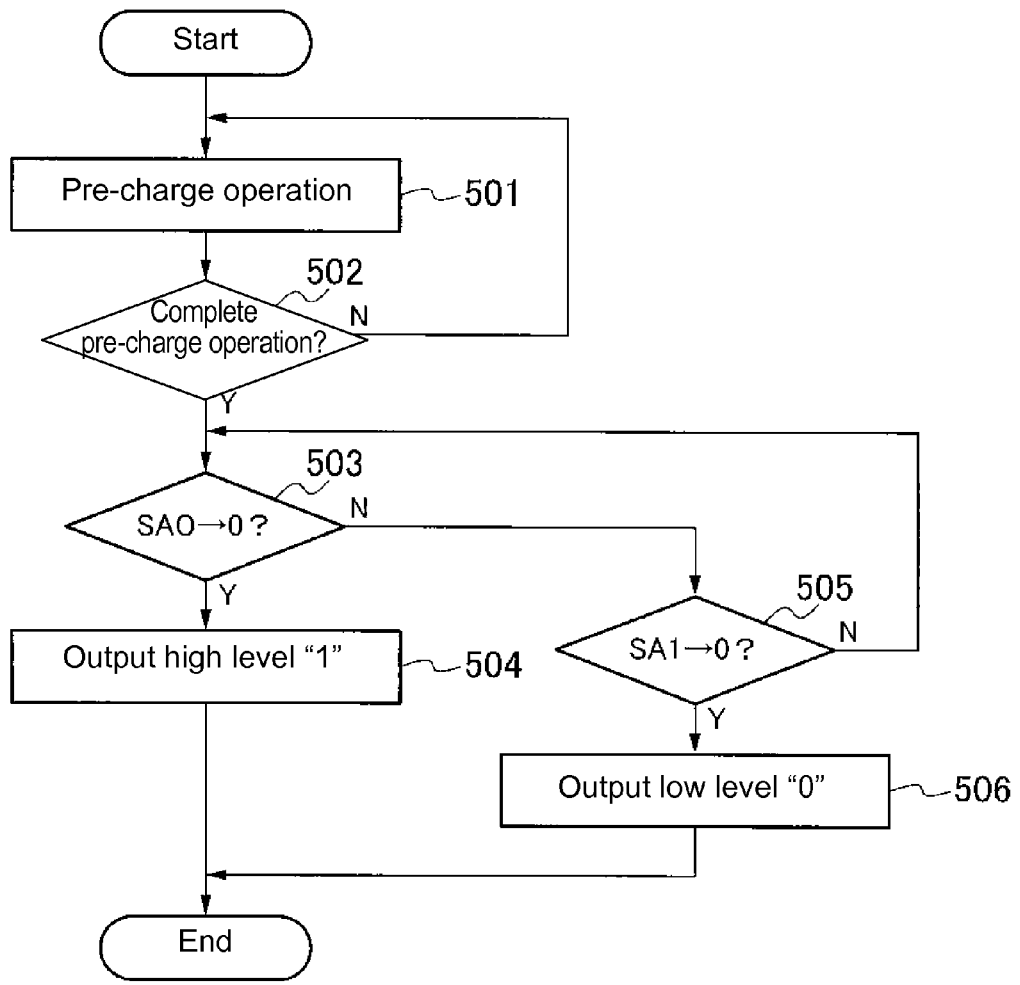
FIG. 5 is a flow chart showing the operation of the semiconductor device in a data retrieving process according to the first embodiment and the second embodiment of the present invention.

FIG. 5 is a flow chart showing the operation of the semiconductor device in the data retrieving process according to the first embodiment and the second embodiment of the present invention.

In step 501, the pre-charge operation is performed on the bit line. In step 502, it is determined whether the pre-charge operation is completed. In step 503, after the pre-charge operation is completed, it is determined whether the sense amplifiers SA01 to SA08 become the low level "0".

In step S504, when it is determined that the sense amplifiers SA01 to SA08 become the low level "0" in step 503, the latch circuits LA1 to LA8 output the high level "1". In step S505, when it is determined that the sense amplifiers SA01 to SA08 do not become the low level "0" in step 503, it is determined whether the sense amplifiers SA11 to SA18 become the low level "0". In step S506, when it is determined that the sense amplifiers SA11 to SA18 become the low level "0" in step 505, the latch circuits LA1 to LA8 output the low level "0".

In the second embodiment, in which the semiconductor device includes the NOR circuit 13e as shown in FIG. 3, when it is determined that the sense amplifiers SA01 to SA08 become the low level "0" first in step 503, the latch circuits LA1 to LA8 output the high level "1" in step S504. Further, the current flowing through the sense amplifiers SA01 to SA08 and the sense amplifiers SA11 to SA18 is shut down. When it is determined that the sense amplifiers SA11 to SA18 become the low level "0" first in step 505, the latch circuits LA1 to LA8 output the high level "1" in step S506. Further, the current flowing through the sense amplifiers SA01 to SA08 and the sense amplifiers SA11 to SA18 is shut down.

Third Embodiment

Figure 6:
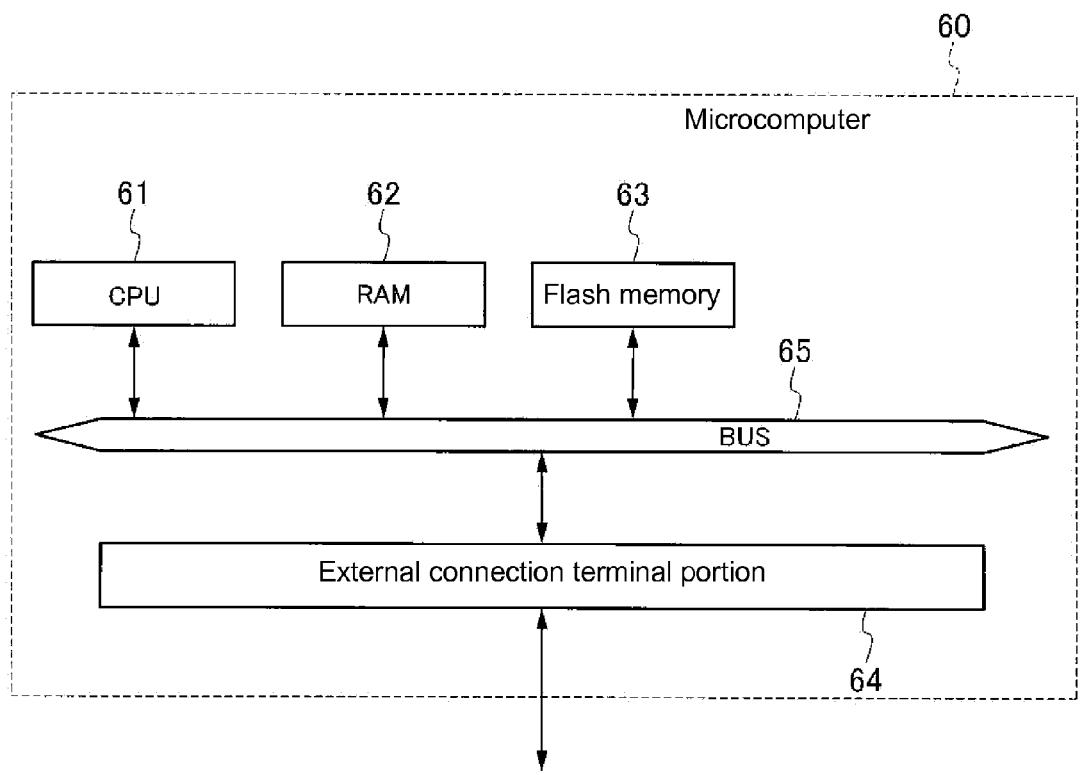
FIG. 6 is a block diagram showing a configuration of a microcomputer having the semiconductor device according to a third embodiment of the present invention.
Figure 7:
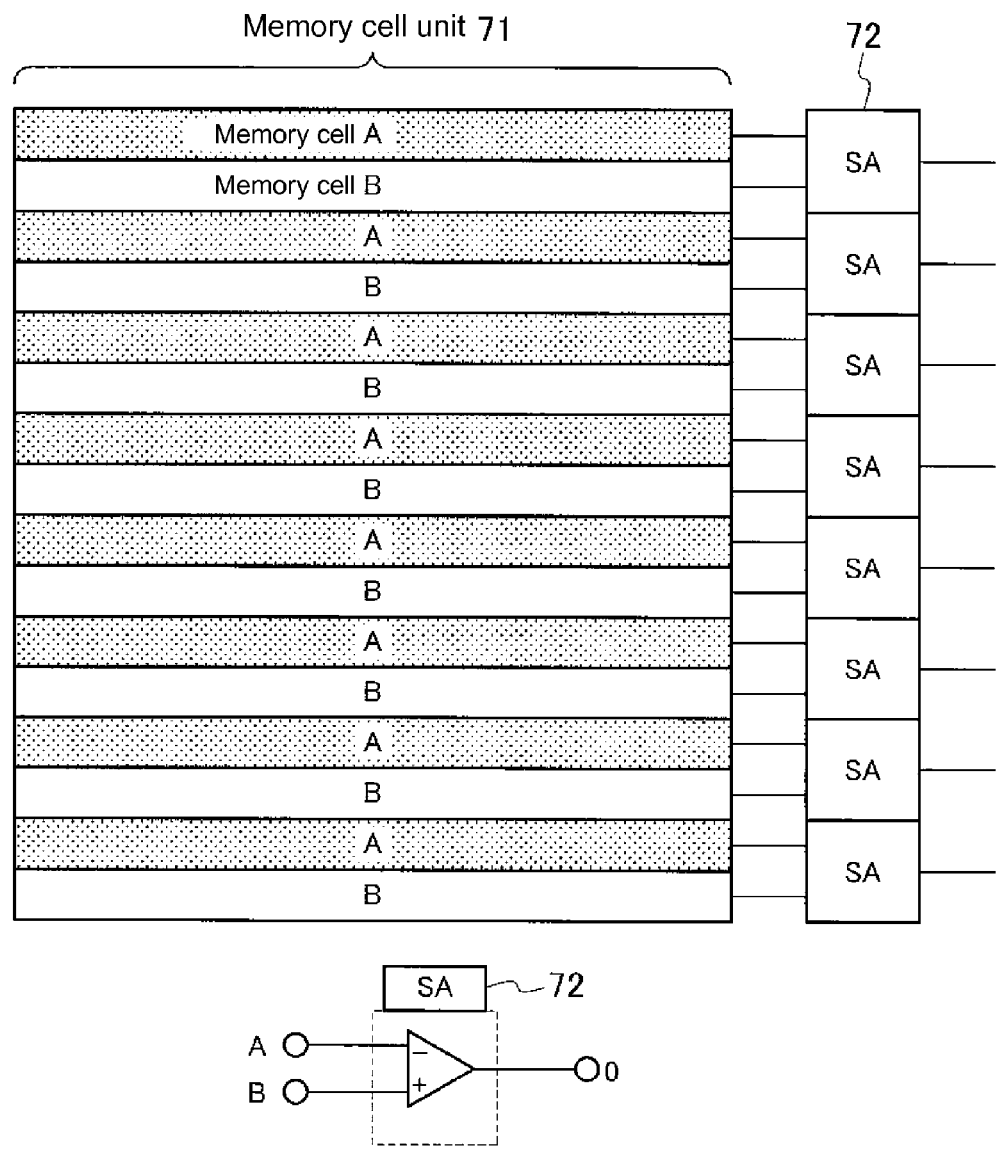
FIG. 7 is a schematic diagram showing a configuration of a conventional semiconductor device.

A third embodiment of the present invention will be explained next with reference to FIG. 6. FIG. 6 is a block diagram showing a configuration of a microcomputer 60 according to the third embodiment of the present invention. The microcomputer 60 includes the semiconductor device 10 described above with reference to FIGS. 1 to 5.

In the third embodiment, the microcomputer 60 is formed on one single semiconductor chip formed of, for example, single crystal silicon. As shown in FIG. 6, the microcomputer 60 includes a CPU (Central Processing Unit) 61 for performing a computer process according to a program; an RAM (Random Access Memory) 62 functioning as a work area when the CPU executes various programs; a flash memory 63 as a storage medium for storing various control programs and various parameters in advance; and an external connection terminal portion 64 for externally receiving a signal. It should be noted that the flash memory 63 corresponds to the semiconductor device 10 having the memory cells and the sense amplifiers described in the first and second embodiments with reference to FIGS. 1 to 5.

In the third embodiment, the external connection terminal portion 64 is connected to the CPU 61, the RAM 62 and the flash memory 63 through a bus 65. Accordingly, the CPU 61 is capable of accessing the RAM 62 and the flash memory 63 through the bus 65, or inputting the signal transmitted from an external device that is connected to the external connection terminal portion 64. The microcomputer 60 having the configuration described above may be connected to, for example, a thermometer or a clock that can be operated using a 1.5 V battery.

As described above, in the third embodiment of the present invention, in the flash memory 63 as the semiconductor device 10 having the configuration shown in FIG. 1 or 3 for performing the operation shown in FIG. 2 or 4, the memory cells D0 and D1 are disposed in the memory cell unit 12 for storing in advance the reference data and the inverted data with the high level "0" and the low level "0". The memory cells A1 to A8 are connected to the input terminals of the differential sense amplifiers SA01 to SA08 and the input terminals of the differential sense amplifiers SA11 to SA18 disposed in the sense amplifier unit 13, respectively, for writing and retrieving the data in the normal operation. Further, the memory cells D0 and D1 are connected to the input terminals of the differential sense amplifiers SA01 to SA08 and the input terminals of the differential sense amplifiers SA11 to SA18 disposed in the sense amplifier unit 13, respectively. Accordingly, it is possible to accurately perform the data retrieving process at the low voltage without increasing the number of the memory cells.

In particular, the ratio of the area for forming one sense amplifier to the area for forming one memory cell is greater than 1:10. In the third embodiment of the present invention, although the number of the sense amplifiers is increased, as opposed to the conventional configuration disclosed in Patent References No. 1 and No. 2, where two memory cells are provided relative to one data, it is still possible to reduce the circuit size.

Further, similar to the second embodiment, the NOR circuit may be connected to the output terminals of the two NOR circuits in each of the latch circuits LA1 to LA8. Further, the output terminal DPB of the NOR circuit is connected to the power down terminals of the differential sense amplifiers SA01 to SA08 and the differential sense amplifiers SA11 to SA18. Accordingly, when the data is completely retrieved, it is possible to shut down the current flowing through the differential sense amplifiers SA01 to SA08 and the differential sense amplifiers SA11 to SA18, thereby reducing power consumption of the semiconductor device 10.

It should be noted that the present invention is not limited to the first to third embodiments described above, and the present invention can be modified within the scope thereof. For example, in the first to third embodiments described above, the memory cells are formed of the configuration of eight bits/one word. There is no limitation in the number of bits per one word, and the present invention is applicable to the memory cells formed of a configuration of 16 bits/one word, 32 bits/one word, 64 bits/one word, and the like.

Further, in the first to third embodiments described above, the semiconductor device 10 is provided with eight of the sense amplifiers SA01 to SA08, eight of the sense amplifiers SA11 to SA18, and eight of the latches LA1 to LA8 corresponding to the memory cells A1 to A8. Alternatively, the semiconductor device 10 may include a column selector, so that the semiconductor device 10 is provided with one of the sense amplifiers SA01 to SA08, one of the sense amplifiers SA11 to SA18, and one of the latches LA1 to LA8 corresponding to each of the memory cells A1 to A8. Accordingly, it is possible to reduce the number of the sense amplifiers and the latch circuits.

Further, in the third embodiment described above, the various programs and the various parameters are stored in advance in the memory cells A1 to A8 in the flash memory 63 shown in FIG. 6. In this case, a user of the microcomputer 60 having the semiconductor device 10 may program the various programs and the various parameters according to a device (for example, a thermometer or a clock) to be controlled with the microcomputer 60. Accordingly, the various programs and the various parameters are stored in advance in the memory cells A1 to A8 when the device is produced. Then, when the product is used, the various programs and the various parameters are retrieved from the memory cells A1 to A8 and executed with the CPU 61 in the microcomputer 60, thereby performing an operation complying with the specification of the device.

Further, in the third embodiment described above, the various programs and the various parameters are stored in advance in the flash memory 63 shown in FIG. 6 as the memory cells. Alternatively, the microcomputer 60 may be provided with a split gate-type flash memory element, a stacked gate-type flash memory, and the like. Further, the memory cells are not limited to the flash memory 63, and may be applicable to other type of non-volatile memory, volatile memory, and the like.

The disclosure of Japanese Patent Application No. 2012-136843, filed on Jun. 18, 2012, is incorporated in the application by reference.

While the invention has been explained with reference to the specific embodiments of the invention, the explanation is illustrative and the invention is limited only by the appended claims.

What is claimed is:

1. A semiconductor device comprising:
    a data memory cell for storing data;
    a reference data memory cell for storing reference data to be compared with the data;
    an inverted data memory cell for storing inverted data of the reference data;
    a sense amplifier unit; and
    a data output unit,
    wherein said sense amplifier unit is configured to perform a first retrieving process, in which the sense amplifier unit differentially amplifies the data stored in the data memory cell and the reference data stored in the reference data memory cell, and adjusts an output thereof when a voltage difference between the data and the reference data becomes a predetermined retrievable voltage difference,
    said sense amplifier unit is configured to perform a second retrieving process, in which the sense amplifier unit differentially amplifies the data stored in the data memory cell and the inverted data stored in the inverted data memory cell, and adjusts an output thereof when a voltage difference between the data and the inverted data becomes the predetermined retrievable voltage difference, and
    said data output unit is configured to determine and output the data stored in the data memory cell according to a result of the first retrieving process and a result of the second retrieving process performed with the sense amplifier unit.

2. The semiconductor device according to claim 1, wherein said data output unit is configured to determine and output the data corresponding to the result of the first retrieving process or the result of the second retrieving process in which the output is changed first.

3. The semiconductor device according to claim 1, wherein said data memory cell is configured to store the data having one of a low level and a high level,
    said reference data memory cell is configured to store the reference data having the low level in advance,
    said inverted data memory cell is configured to store the inverted data having the high level in advance,
    said sense amplifier unit includes a first sense amplifier and a second sense amplifier,
    said first sense amplifier includes a first input terminal connected to the data memory cell, and a second input terminal connected to the reference data memory cell,
    said first sense amplifier is configured to change an output thereof when a voltage difference between the data and the reference data becomes the predetermined retrievable voltage difference,
    said second sense amplifier includes a third input terminal connected to the data memory cell, and a fourth input terminal connected to the inverted data memory cell,
    said second sense amplifier is configured to change an output thereof when a voltage difference between the data and the inverted data becomes the predetermined retrievable voltage difference, said data output unit is configured to output the data having the low level when an output of the first sense amplifier is changed before an output of the second sense amplifier, and said data output unit is configured to output the data having the high level when an output of the second sense amplifier is changed before an output of the first sense amplifier.

4. The semiconductor device according to claim 1, further comprising a retrieval terminating unit for terminating the first retrieving process and the second retrieving process after the data output unit outputs the data.

5. The semiconductor device according to claim 1, further comprising a retrieval terminating unit for terminating the first retrieving process and the second retrieving process, and for changing the result of the first retrieving process and the result of the second retrieving process to the low level after the data output unit outputs the data.

6. The semiconductor device according to claim 3, wherein said data output unit includes a latch circuit including a first NOR circuit and a second NOR circuit, said latch circuit includes a reset terminal connected to the first sense amplifier and a set terminal connected to the second sense amplifier, said data output unit further includes a third NOR circuit, said third NOR circuit includes a fifth input terminal connected to the first NOR circuit, a sixth input terminal connected to the second NOR circuit, and an output terminal connected to power down terminals of the first sense amplifier and the second sense amplifier, and said data output unit is configured to input the low level from the output terminal of the third NOR circuit to the power down terminals of the first sense amplifier and the second sense amplifier so that an electric current flowing through the first sense amplifier and the second sense amplifier when one of the outputs of the first sense amplifier and the second sense amplifier is changed, and one of outputs of the first NOR circuit and the second NOR circuit becomes the high level.

7. The semiconductor device according to claim 3, wherein said data output unit includes a latch circuit including a first NOR circuit and a second NOR circuit, said latch circuit includes a reset terminal connected to the first sense amplifier and a set terminal connected to the second sense amplifier, said data output unit further includes a third NOR circuit, said third NOR circuit includes a fifth input terminal connected to the first NOR circuit, a sixth input terminal connected to the second NOR circuit, and an output terminal connected to power down terminals of the first sense amplifier and the second sense amplifier, and said data output unit is configured to change one of inputs of the first sense amplifier and the second sense amplifier to the low level and hold an input of the latch circuit when the other one of the outputs of the first sense amplifier and the second sense amplifier is changed to the low level, and one of outputs of the first NOR circuit and the second NOR circuit becomes the high level.

8. The semiconductor device according to claim 1, wherein said data memory cell includes an N number of data memory cells, said sense amplifier unit is configured to perform the first retrieving process relative to the data stored in each of the data memory cells and the reference data, said sense amplifier unit is configured to perform the second retrieving process relative to the data stored in each of the data memory cells and the inverted data, and said data output unit is configured to determine and output the data stored in each of the data memory cells according to the result of the first retrieving process and the result of the second retrieving process performed with the sense amplifier unit.

9. A method of retrieving data in a semiconductor device, wherein said semiconductor device includes a data memory cell for storing data; a reference data memory cell for storing reference data to be compared with the data; an inverted data memory cell for storing inverted data of the reference data; a sense amplifier unit; and a data output unit, said method comprising:

a first retrieving step of differentially amplifying the data stored in the data memory cell and the reference data stored in the reference data memory cell, and adjusting an output of the sense amplifier unit when a voltage difference between the data and the reference data becomes a predetermined retrievable voltage difference;

a second retrieving step of differentially amplifying the data stored in the data memory cell and the inverted data stored in the inverted data memory cell, and adjusting an output of the sense amplifier unit when a voltage difference between the data and the inverted data becomes the predetermined retrievable voltage difference; and a data output step of determining and outputting the data stored in the data memory cell according to a result of the first retrieving process and a result of the second retrieving process performed with the sense amplifier unit.

10. A microcomputer comprising:

the semiconductor device according to claim 1;

a bus; and a central processing unit for accessing to the data memory cell through the bus.

* * * * *